(12) United States Patent
Henrici et al.

(10) Patent No.: US 9,979,055 B2
(45) Date of Patent: May 22, 2018

(54) SENSOR APPARATUS FOR A BATTERY CELL OF AN ELECTRICAL ENERGY STORE, BATTERY CELL, METHOD FOR PRODUCING SAID CELL AND METHOD FOR TRANSMITTING SENSOR DATA INSIDE SAID CELL

(71) Applicant: Robert Bosch GmbH, Stuttgart (DE)

(72) Inventors: Fabian Henrici, Stuttgart (DE); Remigius Has, Grafenau-Daetzingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 323 days.

(21) Appl. No.: 14/388,379

(22) PCT Filed: Feb. 13, 2013

(86) PCT No.: PCT/EP2013/052804
§ 371 (c)(1),
(2) Date: Sep. 26, 2014

(87) PCT Pub. No.: WO2013/143755
PCT Pub. Date: Oct. 3, 2013

(65) Prior Publication Data
US 2015/0054518 A1 Feb. 26, 2015

(30) Foreign Application Priority Data
Mar. 29, 2012 (DE) .................. 10 2012 205 136

(51) Int. Cl.
*H01M 10/48* (2006.01)
*H04Q 9/00* (2006.01)
(Continued)

(52) U.S. Cl.
CPC .......... *H01M 10/48* (2013.01); *B60L 3/0046* (2013.01); *B60L 3/0069* (2013.01); *B60L 3/12* (2013.01);
(Continued)

(58) Field of Classification Search
CPC .................................................... H01M 10/48
(Continued)

(56) References Cited

U.S. PATENT DOCUMENTS

| 5,332,315 A * | 7/1994 | Baker | ..................... G01D 9/005 |
|---|---|---|---|
| | | | 340/870.17 |
| 6,269,266 B1 * | 7/2001 | Leysieffer | ............ H04R 25/554 |
| | | | 607/2 |

(Continued)

FOREIGN PATENT DOCUMENTS

| CN | 101187805 A | 5/2008 |
|---|---|---|
| DE | 197 05 192 | 10/1997 |

(Continued)

OTHER PUBLICATIONS

International Search Report for PCT/EP2013/052804, dated May 6, 2013.

*Primary Examiner* — Samuel Berhanu
*Assistant Examiner* — Tessema Kebede
(74) *Attorney, Agent, or Firm* — Norton Rose Fulbright US LLP; Gerard Messina

(57) ABSTRACT

A sensor apparatus for a battery cell of an electrical energy reservoir is provided, which battery cell has a housing. The sensor apparatus has: a sensing device for sensing sensor data with regard to the battery cell, which sensing device is located inside the housing of the battery cell and has a coupling element for inductive emission of the sensor data and for inductive reception of electrical power; an evaluation device for evaluating the sensor data, which evaluation
(Continued)

device is located inside or outside the housing of the battery cell and has a transfer element for inductive transfer of electrical power to the sensing apparatus and for inductive reception of the sensor data from the sensing apparatus.

19 Claims, 4 Drawing Sheets

(51) Int. Cl.

| | | |
|---|---|---|
| *G01R 31/36* | (2006.01) | |
| *B60L 3/00* | (2006.01) | |
| *B60L 3/12* | (2006.01) | |
| *B60L 11/18* | (2006.01) | |
| *H01M 10/42* | (2006.01) | |
| *H04B 3/54* | (2006.01) | |
| *H01M 10/052* | (2010.01) | |

(52) U.S. Cl.
CPC ....... *B60L 11/1859* (2013.01); *B60L 11/1879* (2013.01); *G01R 31/3606* (2013.01); *G01R 31/3655* (2013.01); *G01R 31/3682* (2013.01); *H01M 10/4257* (2013.01); *H01M 10/486* (2013.01); *H04B 3/548* (2013.01); *H04Q 9/00* (2013.01); *B60L 2240/545* (2013.01); *B60L 2240/547* (2013.01); *B60L 2240/549* (2013.01); *H01M 10/052* (2013.01); *H04B 2203/5445* (2013.01); *H04B 2203/5458* (2013.01); *H04Q 2209/40* (2013.01); *H04Q 2209/88* (2013.01); *Y02E 60/122* (2013.01); *Y02P 70/54* (2015.11); *Y02T 10/7005* (2013.01); *Y02T 10/705* (2013.01); *Y10T 29/49004* (2015.01)

(58) Field of Classification Search
USPC .......................................................... 324/426
See application file for complete search history.

(56) References Cited

U.S. PATENT DOCUMENTS

| | | | | |
|---|---|---|---|---|
| 7,478,108 | B2* | 1/2009 | Townsend | G08B 21/0446 |
| 8,140,168 | B2* | 3/2012 | Olson | A61N 1/3787 |
| | | | | 600/13 |
| 9,054,397 | B2* | 6/2015 | Engle | H01M 10/482 |
| 9,086,460 | B2* | 7/2015 | Rice | G01R 31/3606 |
| 9,267,993 | B2* | 2/2016 | Farmer | G01N 25/20 |
| 2002/0024450 | A1* | 2/2002 | Townsend | G08B 21/0446 |
| | | | | 340/870.16 |
| 2002/0051551 | A1* | 5/2002 | Leysieffer | A61N 1/375 |
| | | | | 381/323 |
| 2005/0218902 | A1* | 10/2005 | Restaino | G01R 19/16542 |
| | | | | 324/433 |
| 2007/0182367 | A1* | 8/2007 | Partovi | H01F 5/003 |
| | | | | 320/108 |
| 2008/0161656 | A1* | 7/2008 | Bruce | A61B 5/0031 |
| | | | | 600/300 |
| 2010/0203368 | A1* | 8/2010 | Matthias | H01M 2/204 |
| | | | | 429/90 |

FOREIGN PATENT DOCUMENTS

| | | |
|---|---|---|
| DE | 10 2005 045218 | 4/2007 |
| EP | 0 511 807 | 11/1992 |

* cited by examiner

SENSOR APPARATUS FOR A BATTERY CELL OF AN ELECTRICAL ENERGY STORE, BATTERY CELL, METHOD FOR PRODUCING SAID CELL AND METHOD FOR TRANSMITTING SENSOR DATA INSIDE SAID CELL

BACKGROUND OF THE INVENTION

1. Field of the Invention

The present invention relates to a sensor apparatus for a battery cell of an electrical energy reservoir, to a battery cell for an electrical energy reservoir, to a method for manufacturing a battery cell of an electrical energy reservoir, and to a method for transferring sensor data inside a battery cell of an electrical energy reservoir, in particular for use in electric vehicles, hybrid electric vehicles, and the like.

2. Description of the Related Art

As the demand, for example, for alternative drive concepts continues to rise, attention is increasingly being focused in particular on electric drive systems. In the automobile industry, for example, rechargeable battery packs that are used are made up usually of multiple modules that in turn can be assembled from several e.g. lithium ion cells. One particular challenge here is an effective battery management system that can monitor the function of individual cells of the battery and control their charging process. In addition, for example, defective cells can be shut off and/or bypassed and status messages regarding a charge status can be outputted. Published German patent application document DE 197 05 192 A1 describes a battery monitoring system.

BRIEF SUMMARY OF THE INVENTION

The present invention provides a sensor apparatus for a battery cell of an electrical energy reservoir, the battery cell having a housing, the sensor apparatus having the following features:

a sensing device for sensing sensor data with regard to the battery cell, the sensing device being locatable or located inside the housing of the battery cell and having a coupling element for inductive emission of the sensor data and for inductive reception of electrical power; and an evaluation device for evaluating the sensor data, the evaluation device being locatable or located inside or outside the housing of the battery cell and having a transfer element for inductive transfer of electrical power to the sensing apparatus and for inductive reception of the sensor data from the sensing apparatus.

The electrical energy reservoir can be a battery, a so-called battery pack, etc., for example for an electric vehicle or the like. The electrical energy reservoir can have a plurality of battery cells or cells, in particular in the form of galvanic or electrochemical secondary cells, as sub-units of the energy reservoir; the battery cells can form the electrical energy reservoir. Alternatively, the electrical energy reservoir can have a single battery cell. The housing of the battery cell can be or can become hermetically sealed. An electrochemical reaction apparatus and sub-segments of battery terminals can be receivable or received inside the housing. Terminal segments of the battery terminals of the battery cell can extend at least partly out of the housing. The sensing device can have at least one sensor element, one sensor, or the like for sensing at least one status variable of the battery cell in the form of the sensor data. The at least one sensor element of the sensing device can be electrically connectable or connected to the coupling element. The coupling element can be an electrical coil or the like. The coupling element can be embodied to output the sensed sensor data by inductive coupling to the evaluation device, in particular to its transfer element. The coupling element can furthermore be embodied to receive, by inductive coupling, electrical energy or power from the evaluation device, in particular from its transfer element. The evaluation device can have an electronics subassembly having, for example, an application-specific integrated circuit (ASIC). The electronics subassembly of the evaluation device can be electrically connectable or connected to the transfer element. The transfer element can be an electrical coil or the like. The transfer element can be embodied to output electrical energy or power by inductive coupling to the sensing device, in particular to its coupling element. The transfer element can furthermore be embodied to receive the outputted sensor data by inductive coupling from the sensing device, in particular from its coupling element. At least one further sensing device can also be inductively coupled to the evaluation device. The sensor apparatus can thus be at least partly locatable or located inside the housing of the battery cell. Either (i) the sensing device and the evaluation device can be locatable or located inside the housing of the battery cell, or (ii) the sensing device can be locatable or located inside and the evaluation device outside the housing of the battery cell.

The present invention moreover provides a battery cell for an electrical energy reservoir, the battery cell having the following features:

an electrochemical reaction apparatus having an anode electrode that is connected or connectable to a first battery terminal, and a cathode electrode that is connected or connectable to a second battery terminal;

a housing inside which the electrochemical reaction apparatus is receivable or received, the first battery terminal and the second battery terminal being guidable or guided out of the housing; and a sensor apparatus recited above that is locatable or located at least partly inside the housing of the battery cell, the evaluation device of the sensor apparatus being electrically insertable or inserted, inside or outside the housing of the battery cell, between the first battery terminal and the second battery terminal.

A sensor apparatus recited above can advantageously be used or utilized in combination with the battery cell in order to sense sensor data, inside the cell, with regard to at least one status variable of the battery cell, a transfer of energy and sensor data occurring inside the sensor apparatus inductively in at least a sub-segment of a transfer path. Either (i) the sensing device and the evaluation device can be locatable or located inside the housing of the battery cell, or (ii) the sensing device can be locatable or located inside and the evaluation device outside the housing of the battery cell. The first battery terminal has a contact segment locatable or located outside the housing or on an outer surface of the housing. The second battery terminal has a contact segment locatable or located outside the housing or on an outer surface of the housing. An electrical connection to the battery cell from outside the battery cell can be created via the battery terminals or their contact segments. The anode electrode can be connectable or connected to the first battery terminal, for example, by a first electrical lead. The cathode electrode can be connectable or connected to the second battery terminal, for example, via a second electrical lead. The anode electrode and the cathode electrode can be locatable or located in contact with an electrolyte. A separator device or a separator can furthermore be located between the anode electrode and the cathode electrode.

The present invention furthermore provides a method for manufacturing a battery cell of an electrical energy reservoir, the method having the following steps:

furnishing an electrochemical reaction apparatus that has an anode electrode connected to a first battery terminal and a cathode electrode connected to a second battery terminal; a sensing device for sensing sensor data with regard to the battery cell, the sensing device having a coupling element for inductive emission of the sensor data and for inductive reception of electrical power; and an evaluation device for evaluating the sensor data, the evaluation device having a transfer element for inductive transfer of electrical power to the sensing apparatus and for inductive reception of the sensor data from the sensing apparatus;

connecting the evaluation device to the first battery terminal and to the second battery terminal;

attaching the sensing device adjacently to the evaluation device so that an inductive coupling is producible between the coupling element of the sensing device and the transfer element of the evaluation device; and enclosing the electrochemical reaction apparatus and the sensing device, or the electrochemical reaction apparatus, the sensing device, and the evaluation device, using a housing, the first battery terminal and the second battery terminal being guided out of the housing.

An advantageous battery cell recited above, having a sensor apparatus, can be manufactured by executing the manufacturing method. In the connecting step, an electrical connection can be created between the evaluation device and the battery terminals. In the attaching step a mechanical connection can be created, for example by adhesive bonding. In the enclosing step a hermetically sealed housing having the battery terminals as external contacts can be formed. Either (i) the sensing device and the evaluation device can be locatable or located inside the housing of the battery cell, or (ii) the sensing device can be locatable or located inside and the evaluation device outside the housing of the battery cell.

The present invention furthermore provides a method for transferring sensor data inside a battery cell of an electrical energy reservoir, the method having the following steps:

furnishing a battery cell that has: an electrochemical reaction apparatus having an anode electrode that is connected to a first battery terminal and having a cathode electrode that is connected to a second battery terminal; a housing inside which the electrochemical reaction apparatus is received, the first battery terminal and the second battery terminal being guided out of the housing; and a sensor apparatus that is located at least partly inside the housing of the battery cell and has a sensing device having a coupling element and an evaluation device having a transfer element, the evaluation device of the sensor apparatus being inserted electrically, inside or outside the housing of the battery cell, between the first battery terminal and the second battery terminal;

inductively emitting, by way of the coupling element of the sensing device, sensor data with regard to the battery cell that have been sensed by way of the sensing device; and inductively receiving the emitted sensor data from the sensing apparatus by way of the transfer element of the evaluation device for evaluation of the received sensor data.

A sensor apparatus recited above can advantageously be used or utilized in combination with the transfer method. A battery cell recited above can also advantageously be used or utilized in combination with the transfer method. Either (i) the sensing device and the evaluation device can be locatable or located inside the housing of the battery cell, or (ii) the sensing device can be locatable or located inside and the evaluation device outside the housing of the battery cell.

Also advantageous is a computer program product having program code that is stored on a machine-readable medium such as a semiconductor memory, a hard drive memory, or an optical memory and is used to carry out the transfer method recited above when the program product is executed on a computer or on an apparatus.

According to embodiments of the present invention, sensor data regarding at least one status variable of the battery cell can be sensed inside the cell. A transfer of energy and sensor data inside the sensor apparatus occurs inductively at least in a sub-segment of a transfer path. An evaluation device and a sensing device of the sensor apparatus are inductively coupled to one another. In particular, the sensing device can acquire energy and output sensor data via inductive coupling. The evaluation device can likewise output energy and receive sensor data via inductive coupling.

An advantage of the present invention is that wireless transfer of sensor data from the sensing device to the evaluation device inside the battery cell via inductive coupling makes possible a simplification and a cost saving. In particular, the overall concept of the construction and connection technology (CCT) to be used is simplified, and a cost saving is effected since, as a result of the inductive evaluation concept, no electrical leads, e.g. no wire bonds, are necessary between the sensing device and the evaluation device in order to read out the sensor information or sensor data. The evaluation device, which, in particular has an ASIC having an integrated coil as transfer element, can thus, for example, be completely molded or encapsulated with sealing compound. This results in simplified construction and connection technology, in particular since packaging of the sensing device can also be simplified. The evaluation device can furthermore carry out the transfer of sensor data or measured values to the outside of the battery cell in wire-conducted fashion, e.g. advantageously by power line communication. The sensor apparatus in which the sensing apparatus is moreover advantageously supplied inductively with energy from the evaluation device thus enables reliable and uncomplicated battery cell monitoring so that damage to or premature failure of the battery cell can be avoided.

According to an embodiment of the sensor apparatus, the sensing device can be embodied to sense a temperature value, a pressure value, and/or a moisture value in the battery cell as sensor data. The sensing device can thus represent a combination sensor or multi-sensor. The sensing device can have multiple sensor elements for sensing multiple status variables. The sensing device can have a sensor element for sensing a temperature, a sensor element for sensing a pressure, and/or a sensor element for sensing a moisture level. An embodiment of this kind offers the advantage that indications of an irreversible capacity loss or aging, in particular electrochemical aging, as well as overcharging and deep discharges, fire, overheating, leaks, overcharging, etc. of the battery cell can be effectively detected and thus prevented. A performance capability and service life of the battery cell can thus be enhanced.

The irreversible capacity loss or aging, for example, can be dependent on several factors. A working temperature of the battery cell, for example, is one of these factors that influences aging. High temperatures promote irreversible capacity loss by accelerating the reaction of an electrode with the electrolyte. Characteristics fields can store, for example, currents as a function of temperature and of the charge state of the battery cell. Overcharging of a battery cell also results in overheating. If this is ignored, the battery cell can in fact catch fire. According to embodiments of the present invention, the sensor apparatus is suitable for avoiding overcharging and deep discharging of the battery cell. The sensor apparatus can thus be embodied to sense the working temperature of the battery cell. Sensing or monitoring of an internal pressure of the battery cell is likewise advantageous. A gradually increasing or weakening internal pressure can indicate operationally related electrochemical aging or an incipient leak in the housing or package. If one battery cell in a series circuit ages, the performance of the entire chain can be impaired. Aging can firstly cause an internal resistance of the battery cell to rise. A spontaneous pressure rise can indicate a severe short-term overload of the cell. In addition to temperature monitoring, pressure monitoring can already provide an early indication to shut off the battery cell or the energy reservoir, since outgassing as a rule develops considerably more quickly than a critical temperature change. Monitoring of these factors using suitable pressure sensors as well as temperature sensors is therefore advantageous. In addition, the components in the battery cell, i.e. electrolyte and electrodes, must be present in very pure form and must be as anhydrous as possible. One possible fault situation here is that residual or penetrating water reacts with a substance inside the battery cell, e.g. combines with the conductive salt $LiPF_6$ to yield hydrofluoric acid HF, which can then attack the electrodes and the battery terminals or diverters and thus negatively affect the capacity of the cell. A water concentration in the components should preferably be no more than 10 ppm. This can be detected via an integrated moisture sensor. In the construction of battery packs or rechargeable battery packs for hybrid and electric vehicles, for example, often as many as 200 individual battery cells are interconnected and packaged together. In addition to temperature, pressure, and/or moisture, an electrical voltage can also be measured for each battery cell. According to embodiments of the present invention, a wiring complexity can thus be minimized.

In particular, the sensing device can have a material, and additionally or alternatively an encasing material, that is chemically resistant upon contact with a medium inside the battery cell. The material that forms at least an outer surface of the sensing device can thus be chemically resistant upon contact with a medium inside the battery cell. An encasing material of a sensor housing or the like, with which the sensing device is lined, coated, encased, or packaged, can also be chemically resistant upon contact with a medium inside the battery cell. The material, and additionally or alternatively the encasing material, is not attacked by chemicals inside the battery cell in particular within a service life of the battery cell. Because of the material selected, the sensing device is robust with respect to possible aggressive media influences on the battery cell, and if necessary can also be closed off in hermetically sealed fashion by way of a coating or the like. The sensing device can thus be integrated into the battery cell even without a complex housing enclosure. An overall concept of the construction and connection technology (CCT) that is to be used can be simplified, and can result in a cost saving, if the sensing device can be used without further packaging.

The evaluation device can also be locatable or located inside the housing of the battery cell and can be embodied to modulate the sensor data and to output the modulated sensor data to at least one battery terminal of the battery cell. The sensing device can be embodied to send the sensor data or measured data by modulation, via at least one of the battery terminals (power line communication), to an external receiver, e.g. a battery management system, for example in the form of a sensor signal. A modulation and output or transfer of the sensor data can be accomplished in carrier-frequency fashion or as a modulation of a carrier frequency. The carrier frequency can be impressed as an electrical voltage or as an electrical current. The sensor data can also be transferred by load modulation. Optionally, the sensing device can have a transmitting device that can be embodied to modulate the sensor data in order to generate a sensor signal and to output the sensor signal at at least one of the battery terminals. The sensing device or transmitting device can be embodied to modulate and output or transfer the sensor data in accordance with a definable protocol upon modulation and output or transfer. The sensing device can also have a receiving device that can be embodied to receive and demodulate a signal from at least one of the battery terminals. An embodiment of this kind offers the advantage that costly additional passthroughs for additional signal leads through the hermetic cell housing can be avoided. An advantageous sensing and transmission of sensor data of the battery cell can thus be carried out by the sensor apparatus without negatively affecting a sealing and a protective function of the housing of the battery cell. The sensor data can be transferred out of the battery cell via leads that exist or are provided, so that no additional wiring complexity for signal leads occurs. The sensor apparatus, and thus also the battery cell, can furthermore advantageously be integrated into a multi-cell electrical energy reservoir in terms of signal communication, sensor data advantageously being capable of being transferred via power supply leads.

The sensor apparatus can furthermore have a circuit board. The evaluation device here is locatable or located inside the housing of the battery cell and on a first main surface of the circuit board, and the sensing device is locatable or located on the first main surface or on a second main surface, situated oppositely to the first main surface, of the circuit board. The evaluation device and the sensing device can be locatable or located within a range of the inductive coupling between them. The transfer element of the evaluation device can be locatable or located directly on the first main surface of the circuit board. The transfer element can be generated on the first main surface of the circuit board, for example, by being printed on or the like. An embodiment of this kind offers the advantage that the sensing device is positionable flexibly and in demand-compatible fashion in order to be coordinated with conditions in the battery cell.

According to an embodiment, the evaluation device can have an electrical circuit having a housing. The transfer element of the evaluation device can be locatable or located inside the housing of the electrical circuit. The electrical circuit can be, for example, an application-specific integrated circuit or ASIC, or another suitable electronic module. The housing of the electrical circuit can encompass a plastic, a sealing compound or molding compound, or the like, the electrical circuit being packaged, or encapsulated or enclosed, in the housing. The electrical circuit and the transfer element can thus form a module of the evaluation device. The electrical circuit and the transfer element can in particular be encapsulated or encapsulatable together. An embodiment of this kind offers the advantage that the evaluation device, and thus the sensor apparatus as well, is compact and space-saving and easy to put in place.

The evaluation device can also have an enclosed electrical circuit. The transfer element of the evaluation device can be locatable or located, together with the enclosed electrical circuit, in a sealing compound. The transfer element can be locatable or located alongside the enclosed electrical circuit or in a manner at least partly surrounding the enclosed electrical circuit. An embodiment of this kind offers the advantage that the enclosed electrical circuit and the transfer element of the evaluation device are positionable in flexible and demand-compatible fashion, and are thus adaptable to a requirements profile in the battery cell.

DETAILED DESCRIPTION OF THE INVENTION

Figure 1:
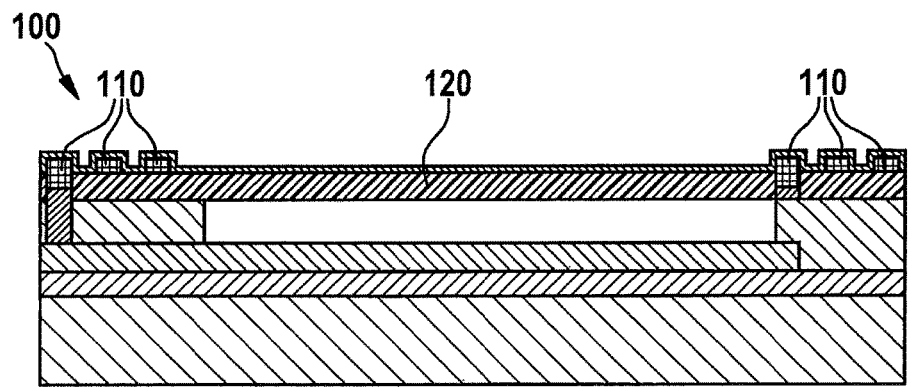
FIG. 1 schematically depicts a sensing device for a sensor apparatus in accordance with an exemplifying embodiment of the present invention.

In the description below of exemplifying embodiments of the present invention, identical or similar reference characters are used for the elements depicted in the various Figures and having a similar function, and said elements are not described again.

FIG. 1 schematically describes a sensing device 100 for a sensor apparatus in accordance with an exemplifying embodiment of the present invention. Sensing device 100 or the sensor apparatus can be part of a battery cell of a, for example, multi-cell electrical energy reservoir. Sensing device 100 is shown in FIG. 1 in a sectioned view. Sensing device 100 has a coupling element 110 in the form of a coil or sensor coil, and a sensor element 120 in the form of a pressure-sensitive membrane. Three windings of the coil of coupling element 110 are shown in FIG. 1 by way of example. Further sensor elements and optionally further electronic modules of sensing device 100 are not explicitly shown or labeled in FIG. 1. Sensing device 100 in accordance with the exemplifying embodiment of the present invention depicted in FIG. 1 has sensor elements that are embodied to carry out a measurement or sensing of pressure, temperature, and optionally moisture inside a battery cell. Sensing device 100 is embodied to generate sensor data based on sensed or measured pressure values, temperature values, and optionally moisture values.

Coupling element 110 is embodied to receive electrical energy via inductive coupling. Coupling element 110 is also embodied to emit the sensor data via inductive coupling. Coupling element 110 is located adjacently to an outer surface of sensing device 100, or constitutes a part thereof. In accordance with the exemplifying embodiment of the present invention depicted in FIG. 1, pressure-sensitive membrane 120 is located between coupling element 110 and further constituents of sensing device 100. FIG. 1 thus schematically depicts a sensor or sensor element, or a sensing device 100, that can be evaluated or read out inductively.

Figure 2:
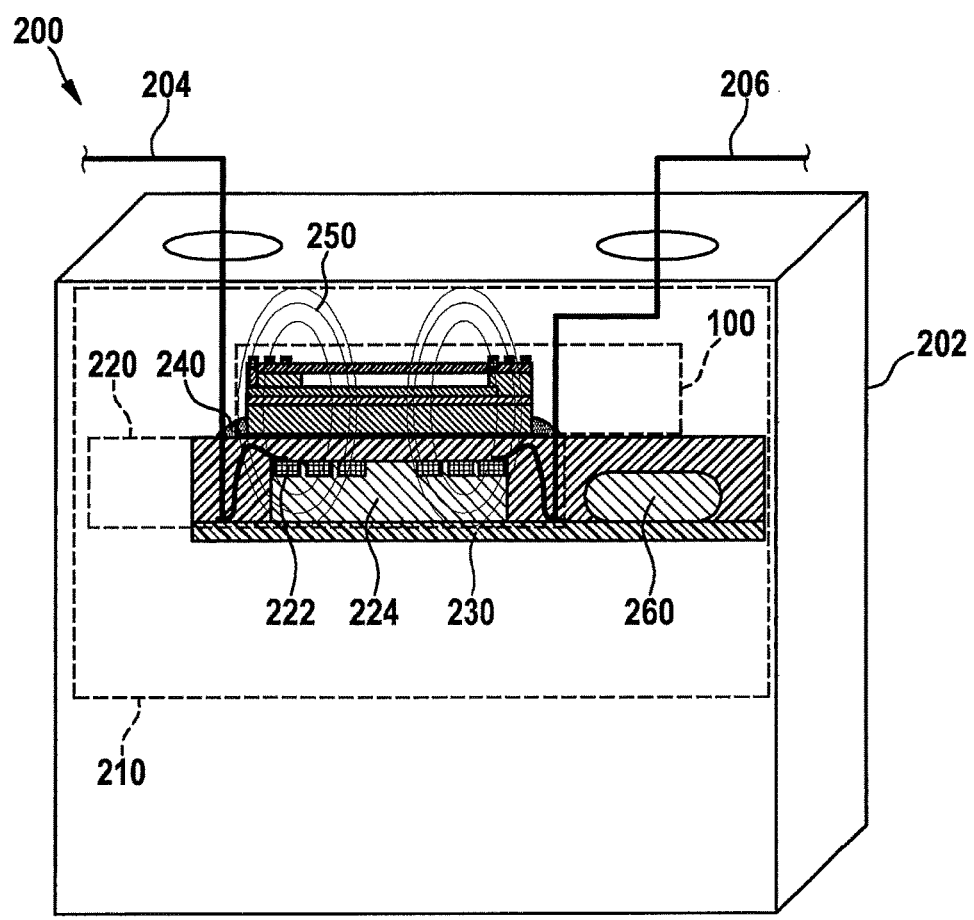
FIG. 2 schematically depicts a battery cell and a sensor apparatus in accordance with an exemplifying embodiment of the present invention.

FIG. 2 schematically depicts a battery cell and a sensor apparatus in accordance with an exemplifying embodiment of the present invention. The Figure shows a sensing device 100 that can be the sensing device of FIG. 1, a battery cell 200, a cell housing or housing 202, a first battery terminal 204, a second battery terminal 206, a sensor apparatus 210, an evaluation device 220, a transfer element 222 in the form of a coil, an electrical circuit 224 e.g. in the form of an application-specific integrated circuit or ASIC, a circuit board 230, an adhesion means 240, a symbolically depicted coupling region 250 of an inductive coupling, and a peripheral circuit element 260 for peripheral connection.

Battery cell 200 encompasses housing 202, first battery terminal 204, second battery terminal 206, sensor apparatus 210, and an electrochemical apparatus not depicted in FIG. 2. Sensor apparatus 210 is located inside housing 202 of battery cell 200. Sensor apparatus encompasses sensing device 100, evaluation device 220, circuit board 230, and adhesion means 240. Evaluation device 220 encompasses transfer element 222 and electrical circuit 224. Evaluation device 220, more precisely its electrical circuit 224, is connected electrically between first battery terminal 204 and second battery terminal 206. Transfer element 222 is connected electrically to electrical circuit 224. Coupling region 250 designates a region of inductive coupling between the coupling element of sensing device 100 and transfer element 222 of evaluation device 220.

Evaluation device 220 is located between sensing device 100 and circuit board 230. Electrical circuit 224 of evaluation device 220 has a circuit housing made, for example, of a sealing compound. In accordance with the exemplifying embodiment of the present invention depicted in FIG. 2, transfer element 222 of evaluation device 220 is located inside the circuit housing of electrical circuit 224. The circuit housing inside which electrical circuit 224 and transfer element 222 are located is encapsulated with encapsulation material. Peripheral circuit element 260 is likewise encapsulated using the encapsulation material. Sensing device 100 is mounted by way of adhesion means 240 on the encapsulation material of electrical circuit 224 or of evaluation device 220. Sensing device 100 is in particular mounted on evaluation device 220 at least partly in coupling region 250. Sensing device 100 is mounted with respect to evaluation device 220 in such a way that the coupling element of sensing device 100 and transfer element 222 of evaluation device 220 are located within the shared coupling region 250.

In accordance with the exemplifying embodiment of the present invention depicted in FIG. 2, first battery terminal 204 and second battery terminal 206 are electrically connected to respective terminals of circuit board 230. Electrical circuit 224 is electrically connected, for example by way of bonding wires or the like, to the terminals of circuit board 230 to which first battery terminal 204 and second battery terminal 206 are electrically connected. First battery terminal 204 and second battery terminal 206 are guided into the encapsulation material respectively of electrical circuit 224 and of evaluation device 220. The bonding wires are furthermore encapsulated in the encapsulation material respectively of electrical circuit 224 and of evaluation device 220.

In other words, FIG. 2 shows integration of an inductively coupled sensor, in the form of sensing device 100, into battery cell 200, e.g. a lithium ion cell, in order to measure pressure, temperature, and moisture in battery cell 200.

Sensing device 100 is adhesively bonded onto evaluation unit 220. Sensing device 100 is situated inside battery cell 200, and conveys the sensor data wirelessly to evaluation device 220 or to the evaluation electronics (ASIC). Evaluation device 220 having an integrated coil as transfer element 222 can be hermetically encapsulated. Evaluation device 220 does not require wire bonds in order to read out sensing device 100. In accordance with the exemplifying embodiment of the present invention depicted in FIG. 2, transfer element 222 and the ASIC coil are co-situated in a molding compound respectively of electrical circuit 224 and of the ASIC. In accordance with another exemplifying embodiment of the present invention, transfer element 222 can be implemented using an uppermost metal layer of an ASIC processor. In accordance with other exemplifying embodiments of the present invention, the inductively coupled sensing device 100 can also be mounted at a different point inside coupling region 250 with reference to electrical circuit 224, for example with circuit board 230 between sensing device 100 and electrical circuit 224.

Figure 3:
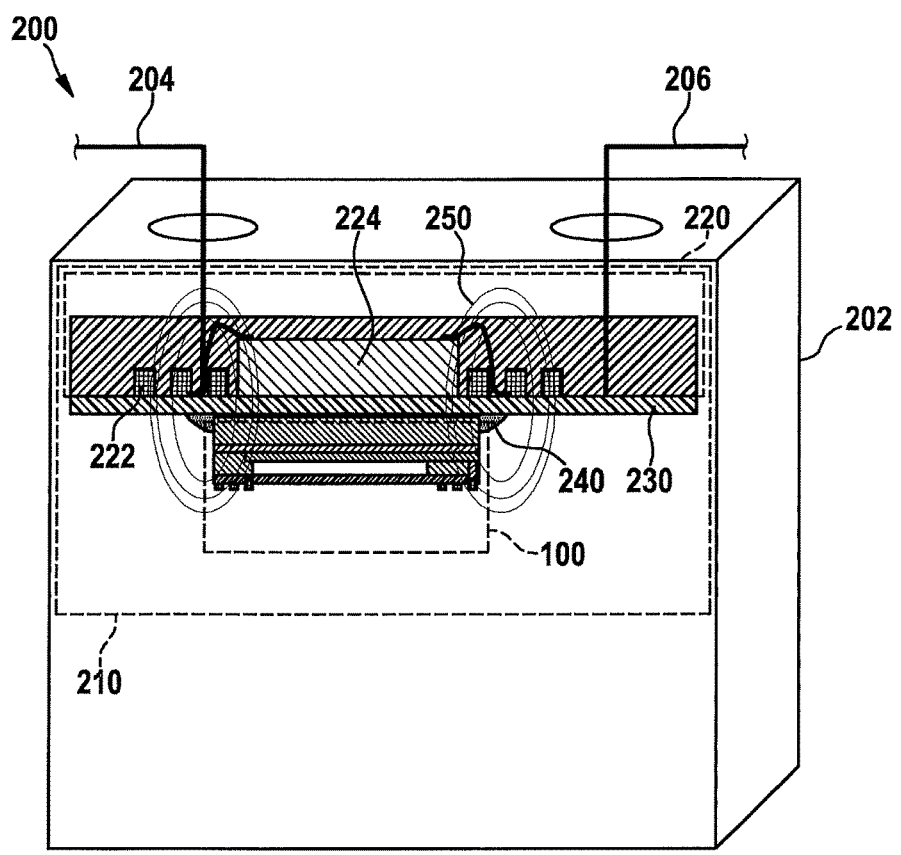
FIG. 3 schematically depicts a battery cell and a sensor apparatus in accordance with a further exemplifying embodiment of the present invention.

FIG. 3 schematically depicts a battery cell and a sensor apparatus in accordance with a further exemplifying embodiment of the present invention. The Figure shows a sensing apparatus 100 that can be the sensing device of FIG. 1, a battery cell 200, a cell housing or housing 202, a first battery terminal 204, a second battery terminal 206, a sensor apparatus 210, an evaluation device 220, a transfer element 222, an electrical circuit 224, a circuit board 230, an adhesion means 240, and a symbolically depicted coupling region 250. Battery cell 200 can be the battery cell of FIG. 2.

Sensor apparatus 210 corresponds to the sensor apparatus of FIG. 2, except that in accordance with the exemplifying embodiment of the present invention depicted in FIG. 3, transfer element 222 is located outside the circuit housing of electrical circuit 224 on circuit board 230, and circuit board 230 is located between sensing device 100 and evaluation device 220. Transfer element 222 is located at least partly surrounding electrical circuit 224. Transfer element 222 is located in contact with circuit board 230, or is constituted thereon. Transfer element 222 and electrical circuit 224 are thus located on a first side or first main surface of circuit board 230. Sensing device 100 is located on a second side or second main surface of circuit board 230. Sensing device 100 is mounted on circuit board 240 by way of adhesion means 240.

In other words, FIG. 3 schematically depicts battery cell 200 having an integrated, inductively coupled sensing device 100 for measuring pressure, temperature, and moisture in battery cell 200. Transfer element 222 can be implemented here in a circuit board design, and surrounds electrical circuit 224. In accordance with the exemplifying embodiment of the present invention depicted in FIG. 3, transfer element 222 is displaced out of the circuit housing onto circuit board 230. In this case transfer element 222 surrounds electrical circuit 224. Transfer element 222 and electrical circuit 224 can be entirely or partly surrounded by a sealing compound or molding compound. In accordance with other exemplifying embodiments of the present invention, the inductively coupled sensing device 100 can also be mounted inside coupling region 250 at a different point with reference to electrical circuit 224 or transfer element 222, for example with electrical circuit 224 or with transfer element 222 between circuit board 230 and sensing device 100.

Figure 4:
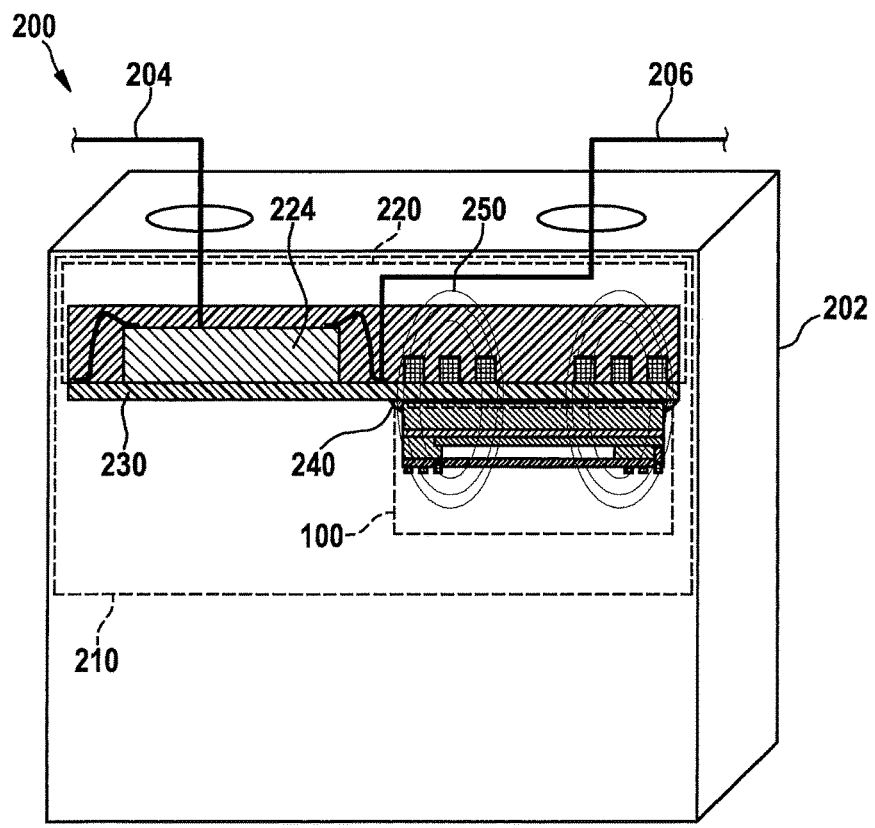
FIG. 4 schematically depicts a battery cell and a sensor apparatus in accordance with yet another exemplifying embodiment of the present invention.

FIG. 4 schematically depicts a battery cell and a sensor apparatus in accordance with yet another exemplifying embodiment of the present invention. The Figure shows a sensing apparatus 100 that can be the sensing device of FIG. 1, a battery cell 200, a cell housing or housing 202, a first battery terminal 204, a second battery terminal 206, a sensor apparatus 210, an evaluation device 220, a transfer element 222, an electrical circuit 224, a circuit board 230, an adhesion means 240, and a symbolically depicted coupling region 250. Battery cell 200 can be the battery cell of FIG. 2 or FIG. 3.

Sensor apparatus 210 is similar to the sensor apparatus of FIG. 2 and corresponds to the sensor apparatus of FIG. 3, except that in accordance with the exemplifying embodiment of the present invention depicted in FIG. 4, transfer element 222 and electrical circuit 224 are located adjacently to one another or in a manner spaced laterally away from each other. Electrical circuit 224 is here located outside a surface enclosed by transfer element 222. Transfer element 222 is located in contact with circuit board 230, or is constituted thereon. Transfer element 222 and electrical circuit 224 are thus located on a first side or first main surface of circuit board 230. Sensing device 100 is located on a second side or second main surface of circuit board 230. Sensing device 100 is mounted on circuit board 240 by way of adhesion means 240. Circuit board 230 is located between sensing device 100 and transfer element 222.

In other words, FIG. 4 schematically depicts battery cell 200 having an integrated, inductively coupled sensing device 100 for measuring pressure, temperature, and moisture in battery cell 200. Electrical circuit 224 is placed on circuit board 230 separately with respect to transfer element 222. Transfer element 222 can be implemented here in a circuit board design, and is situated alongside electrical circuit 224. In accordance with the exemplifying embodiment of the present invention depicted in FIG. 4, transfer element 222 is displaced out onto circuit board 230, and transfer element 222 is mounted alongside electrical circuit 224 on circuit board 230. In accordance with other exemplifying embodiments of the present invention, the sensing device can also be mounted inside coupling region 250 at a different point with reference to transfer element 222, for example with transfer element 222 between circuit board 230 and sensing device 100.

Figure 5:
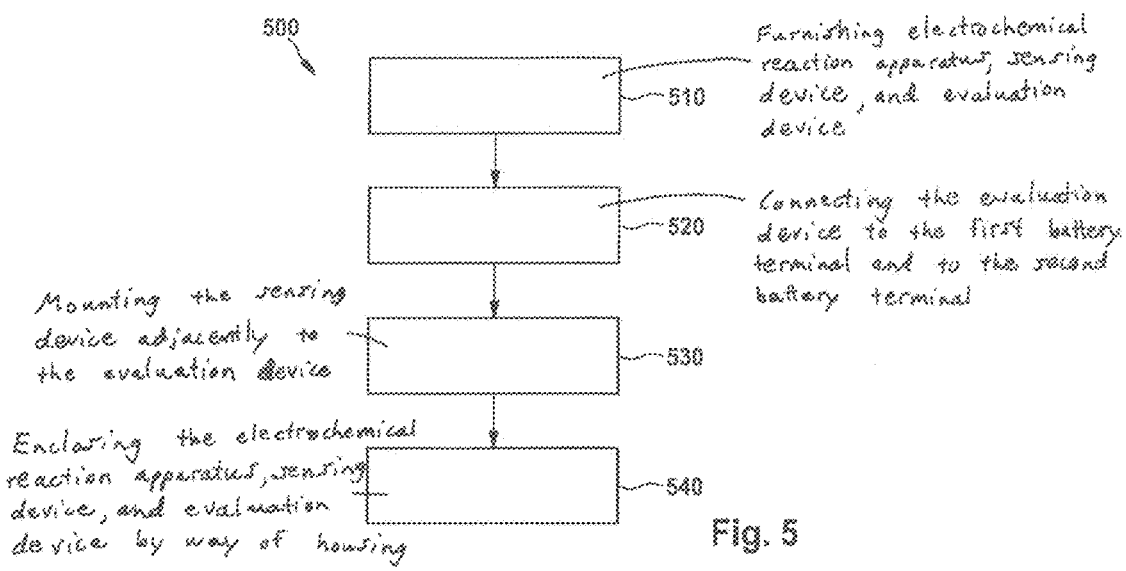
FIG. 5 is a flow chart of a manufacturing method in accordance with an exemplifying embodiment of the present invention.

FIG. 5 is a flow chart of a method 500 for manufacturing a battery cell of an electrical energy reservoir in accordance with an exemplifying embodiment of the present invention. Method 500 has a step of furnishing 510 an electrochemical reaction apparatus, a sensing device for sensing sensor data with regard to the battery cell, and an evaluation device for evaluating the sensor data. The electrochemical reaction apparatus has an anode electrode connected to a first battery terminal and a cathode electrode connected to a second battery terminal. The sensing device has a coupling element for inductive emission of the sensor data and for inductive reception of electrical power. The evaluation device has a transfer element for inductive transfer of electrical power to the sensing apparatus and for inductive reception of the sensor data from the sensing apparatus. Method 500 furthermore has a step of connecting 520 the evaluation device to the first battery terminal and to the second battery terminal. Method 500 also has a step of mounting 530 the sensing device adjacently to the evaluation device so that an inductive coupling is producible between the coupling element of the sensing device and the transfer element of the evaluation device. Method 500 furthermore has a step of enclosing 540 the electrochemical reaction apparatus, the sensing device, and the evaluation device by way of a housing, the first battery terminal and the second battery terminal being guided out of the housing. The battery cell having the sensor apparatus of one of FIGS. 2 to 4, for example, can advantageously be manufactured using method 500.

Figure 6:
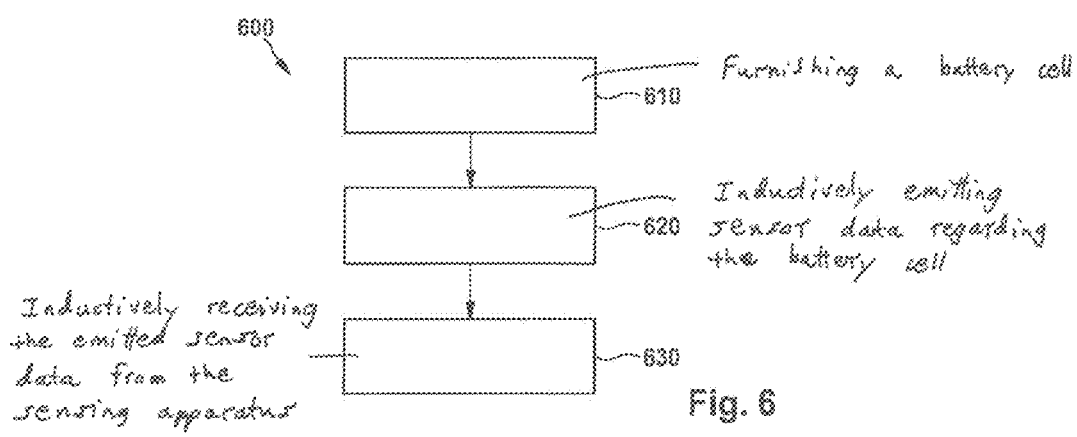
FIG. 6 is a flow chart of a transfer method in accordance with an exemplifying embodiment of the present invention.

FIG. 6 is a flow chart of a method 600 for transferring sensor data inside a battery cell of an electrical energy reservoir, in accordance with an exemplifying embodiment of the present invention. Method 600 has a step of furnishing 610 a battery cell. The battery cell has an electrochemical reaction apparatus that has an anode electrode that is connected to a first battery terminal and a cathode electrode that is connected to a second battery terminal. The battery cell also has a housing inside which the electrochemical reaction apparatus is received, the first battery terminal and the second battery terminal being guided out of the housing. Lastly, the battery cell also has a sensor apparatus that is located inside the housing of the battery cell. The sensor apparatus has a sensing device having a coupling element and an evaluation device having a transfer element. The evaluation element of the sensor apparatus is connected electrically, inside the housing of the battery cell, between the first battery terminal and the second battery terminal. Method 600 furthermore has a step of inductively emitting 620 sensor data regarding the battery cell, sensed by way of the sensing device, by way of the coupling element of the sensing device. Method 600 also has a step of inductively receiving 620 the emitted sensor data from the sensing apparatus by way of the transfer element of the evaluation device in order to evaluate the received sensor data. Method 600 can advantageously be executed in conjunction with the sensor apparatus or battery cell of one of FIGS. 2 to 4.

Referring to FIGS. 1 to 6, the concept on which the various exemplifying embodiments of the present invention are based will be summarized below in different words. Exemplifying embodiments of the present invention relate to a battery cell 200 having an integrated, inductively coupled sensor suite 210. This makes possible a measurement of pressure, temperature, and/or moisture with regard to a battery cell 200 using an integrated, inductively coupled sensor suite 210. A sensor apparatus 210 having an inductively coupled sensing device 100 can be placed in each cell of a multi-cell electrical energy reservoir in order to measure temperature, pressure, and moisture. Exemplifying embodiments of the present invention are utilized in particular in the utilization sector of batteries, in which individual wiring of sensors would result in excessive cost and can be achieved wirelessly within the cell. In addition, an increase in performance can be attained by way of individual battery cell monitoring using exemplifying embodiments of the present invention.

The exemplifying embodiments that have been described and are shown in the Figures are selected merely by way of example. Different exemplifying embodiments can be combined with one another entirely or in terms of individual features. One exemplifying embodiment can also be supplemented with features of a further exemplifying embodiment. Method steps according to the present invention can furthermore be repeated, and can be executed in a sequence other than the one described.

What is claimed is:

1. A sensor apparatus for a battery cell of an electrical energy reservoir, the battery cell having a housing, wherein the sensor apparatus comprises:
a sensing device sensing sensor data with regard to the battery cell, the sensing device being located inside the housing of the battery cell and having a coupling element for inductive emission of the sensor data and for inductive reception of electrical power; and
an evaluation device evaluating the sensor data, the evaluation device being located inside the housing of the battery cell and having a transfer element for inductive transfer of electrical power to the sensing device and for inductive reception of the sensor data from the sensing device,
wherein the evaluation device and the transfer element for inductive transfer and inductive reception are hermetically encapsulated and are located inside the housing of the battery cell, and wherein the housing of the battery cell corresponds to a housing of only a single battery cell.

2. The sensor apparatus as recited in claim 1, wherein the sensing device is configured to sense at least one of a temperature value, a pressure value, and a moisture value in the battery cell as sensor data.

3. The sensor apparatus as recited in claim 2, wherein the sensing device has a material which is chemically resistant to a medium inside the battery cell.

4. The sensor apparatus as recited in claim 1, wherein the evaluation device is located inside the housing of the battery cell and is configured to modulate the sensor data and to output the modulated sensor data to at least one battery terminal of the battery cell.

5. The sensor apparatus as recited in claim 1, further comprising:
a circuit board, wherein the evaluation device is located inside the housing of the battery cell and on a first main surface of the circuit board, and wherein the sensing device is located one of on the first main surface or on a second main surface situated oppositely to the first main surface of the circuit board.

6. The sensor apparatus as recited in claim 4, wherein the evaluation device has an electrical circuit having a housing, the transfer element of the evaluation device being located inside the housing of the electrical circuit.

7. The sensor apparatus as recited in claim 4, wherein the evaluation device has an enclosed electrical circuit, the transfer element of the evaluation device being located, together with the enclosed electrical circuit, in a sealing compound, the transfer element being located one of (i) alongside the enclosed electrical circuit or (ii) at least partly surrounding the enclosed electrical circuit.

8. A battery cell for an electrical energy reservoir, the battery cell comprising:
an electrochemical reaction apparatus having an anode electrode connected to a first battery terminal, and a cathode electrode connected to a second battery terminal;
a housing inside which the electrochemical reaction apparatus is received, the first battery terminal and the second battery terminal being guided out of the housing;
a sensor apparatus including: (i) a sensing device sensing sensor data with regard to the battery cell, the sensing device being located inside the housing of the battery cell and having a coupling element for inductive emission of the sensor data and for inductive reception of electrical power; and (ii) an evaluation device evaluating the sensor data, the evaluation device being inserted inside the housing of the battery cell, between the first and second battery terminals, and the evaluation device having a transfer element for inductive transfer of electrical power to the sensing device and for inductive reception of the sensor data from the sensing device, and wherein the evaluation device and the transfer element for inductive transfer and inductive reception are hermetically encapsulated and are located inside the housing of the battery cell, and wherein the housing of the battery cell corresponds to a housing of only a single battery cell.

9. A method for manufacturing a battery cell of an electrical energy reservoir, comprising:
providing an electrochemical reaction apparatus which has an anode electrode connected to a first battery terminal and a cathode electrode connected to a second battery terminal;
providing a sensing device for sensing sensor data with regard to the battery cell, the sensing device having a coupling element for inductive emission of the sensor data and for inductive reception of electrical power;
providing an evaluation device for evaluating the sensor data, the evaluation device having a transfer element for inductive transfer of electrical power to the sensing device and for inductive reception of the sensor data from the sensing device, the evaluation device and the transfer element for inductive transfer and inductive reception being hermetically encapsulated;
connecting the evaluation device to the first battery terminal and to the second battery terminal;
attaching the sensing device adjacently to the evaluation device so that an inductive coupling is produced between the coupling element of the sensing device and the transfer element of the evaluation device; and
enclosing at least the electrochemical reaction apparatus, the evaluation device, and the sensing device using a housing, wherein the first battery terminal and the second battery terminal are guided out of the housing, and wherein the evaluation device and the transfer element for inductive transfer and inductive reception are located inside the housing of the battery cell, and wherein the housing of the battery cell corresponds to a housing of only a single battery cell.

10. A method for transferring sensor data inside a battery cell of an electrical energy reservoir, comprising:
providing a battery cell which has: an electrochemical reaction apparatus having an anode electrode connected to a first battery terminal and having a cathode electrode connected to a second battery terminal; a housing inside which the electrochemical reaction apparatus is received, the first battery terminal and the second battery terminal being guided out of the housing; and a sensor apparatus located at least partly inside the housing of the battery cell and having (i) a sensing device which includes a coupling element and (ii) an evaluation device having a transfer element configured for inductive transfer of electrical power to the sensing device and for inductive reception of the sensor data from the sensing device, the evaluation device of the sensor apparatus being inserted electrically, inside the housing of the battery cell, between the first battery terminal and the second battery terminal, wherein the sensing device and the evaluation device are both located inside the housing of the battery cell such that the evaluation device and the transfer element are hermetically encapsulated and located inside the housing of the battery cell, and wherein the housing of the battery cell corresponds to a housing of only a single battery cell;
inductively emitting, by way of the coupling element of the sensing device, sensor data with regard to the battery cell which have been sensed by way of the sensing device; and
inductively receiving the emitted sensor data from the sensing apparatus by way of the transfer element of the evaluation device for evaluation of the received sensor data.

11. The sensor apparatus as recited in claim 1, wherein the sensing device and the evaluation device, both located inside the housing of the battery cell, are not connected to each other with wires.

12. The sensor apparatus as recited in claim 1, wherein the evaluation device and the transfer element are hermetically encapsulated using at least one of plastic, a sealing compound, and a molding compound.

13. The sensor apparatus as recited in claim 1, wherein the evaluation device and the transfer element are encapsulated together and are co-situated in a molding compound.

14. The battery cell as recited in claim 8, wherein the evaluation device and the transfer element are hermetically encapsulated using at least one of plastic, a sealing compound, and a molding compound.

15. The battery cell as recited in claim 8, wherein the evaluation device and the transfer element are encapsulated together and are co-situated in a molding compound.

16. The method as recited in claim 9, where the evaluation device and the transfer element are hermetically encapsulated using at least one of plastic, a sealing compound, and a molding compound.

17. The method as recited in claim 9, wherein the evaluation device and the transfer element are encapsulated together and are co-situated in a molding compound.

18. The method as recited in claim 10, where the evaluation device and the transfer element are hermetically encapsulated using at least one of plastic, a sealing compound, and a molding compound.

19. The method as recited in claim 10, wherein the evaluation device and the transfer element are encapsulated together and are co-situated in a molding compound.

* * * * *